United States Patent
Chang (10) Patent No.: US 9,054,202 B2
(45) Date of Patent: Jun. 9, 2015

(54) OXIDE SEMICONDUCTOR THIN FILM TRANSISTOR AND MANUFACTURING METHOD THEREOF

(71) Applicant: Chunghwa Picture Tubes, LTD., Taoyuan (TW)

(72) Inventor: Hsi-Ming Chang, Taoyuan County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 13/965,176

(22) Filed: Aug. 12, 2013

(65) Prior Publication Data

US 2014/0374739 A1 Dec. 25, 2014

(30) Foreign Application Priority Data

Jun. 19, 2013 (TW) .............................. 102121756 A (51) Int. Cl.
*H01L 29/12* (2006.01)
*H01L 29/786* (2006.01)
*H01L 29/66* (2006.01)

(52) U.S. Cl.
CPC ...... *H01L 29/7869* (2013.01); *H01L 29/66969* (2013.01)

(58) Field of Classification Search
CPC ...................... H01L 29/7869; H01L 29/66969
USPC ............................................. 257/43
See application file for complete search history.

(56) References Cited

U.S. PATENT DOCUMENTS

| 7,629,191 B2 | 12/2009 | Chiang et al. |
| 8,119,465 B1 | 2/2012 | Lin et al. |
| 8,377,760 B2 | 2/2013 | Lin et al. |

FOREIGN PATENT DOCUMENTS

TW 201218279 5/2012

*Primary Examiner* — Thien F Tran
(74) *Attorney, Agent, or Firm* — Jianq Chyun IP Office (57) ABSTRACT

An oxide semiconductor thin film transistor includes a source, a drain, a channel layer, an insulation layer, a first conductor and a second conductor. The channel layer is disposed between the source and the drain, and separated from the source and the drain. The insulation layer covers the source, the drain and the channel layer. The first conductor is at least disposed in a first opening of the insulation layer so as to touch the source and the channel layer. The second conductor is at least disposed in a second opening of the insulation layer so as to touch the drain and the channel layer.

4 Claims, 11 Drawing Sheets

OXIDE SEMICONDUCTOR THIN FILM TRANSISTOR AND MANUFACTURING METHOD THEREOF

CROSS-REFERENCE TO RELATED APPLICATION

This application claims the priority benefit of Taiwan application serial no. 102121756, filed on Jun. 19, 2013. The entirety of the above-mentioned patent application is hereby incorporated by reference herein and made a part of this specification.

TECHNICAL FIELD

The disclosure relates to a thin film transistor and a manufacturing method thereof, and particularly relates to an oxide semiconductor thin film transistor and a manufacturing method thereof.

BACKGROUND

Generally speaking, the plurality of elements (e.g. a gate, a source, a drain, a channel layer, and a pixel electrode) that form an oxide semiconductor thin film transistor are manufactured with a plurality of manufacturing processes, respectively. Specifically, the source and the drain are usually manufactured in the same manufacturing process, whereas the channel layer is manufactured with another manufacturing process. In addition, there is no limitation on the order of the manufacturing processes. For example, the source and the drain may be foamed before the channel layer is formed. In addition, when a material layer of the channel layer is formed with a sputtering process, an environmental gas (e.g. oxygen plasma) may form an oxide layer on the surfaces of the source and the drain. Then, when the channel layer covers the source and the drain, oxide layers may exist between the channel layer and the source and between the channel layer and the drain, thus resulting in a higher contact impedance and reducing the device reliability of the oxide semiconductor thin film transistor.

Another manufacture method is to form the channel layer before forming the source and the drain. However, when patterning a conductive layer to form the source and the drain in an etching process, the channel layer located between the source and the drain may be damaged by the etchant, thus reducing the device reliability of the oxide semiconductor thin film transistor.

SUMMARY

An oxide semiconductor thin film transistor of the disclosure includes a source, a drain, a channel layer, an insulation layer, a first conductor, and a second conductor. The channel layer is disposed between the source and the drain and separated from the source and the drain. The insulation layer covers the source, the drain, and the channel layer. The first conductor is at least disposed in a first opening of the insulation layer to contact the source and the channel layer. The second conductor is at least disposed in a second opening of the insulation layer to contact the drain and the channel layer.

A manufacturing method of an oxide semiconductor thin film transistor according to the disclosure includes the following. A source and a drain are formed. A channel layer is formed between the source and the drain, wherein the channel layer is separated from the source and the drain. An insulation layer is formed, wherein the insulation layer covers the source, the drain, and the channel layer. A first conductor is at least formed in a first opening of the insulation layer, wherein the first conductor contacts the source and the channel layer. A second conductor is at least formed in a second opening of the insulation layer, wherein the second conductor contacts the drain and the channel layer.

Based on the above, in the manufacturing method of the oxide semiconductor thin film transistor according to the disclosure, the channel layer is disposed separately from the source and the drain, the first conductor is connected with the channel layer and the source through the first opening of the insulation layer, and the second conductor is connected with the channel layer and the drain through the second opening of the insulation layer. In this way, an oxide semiconductor thin film transistor with a preferable reliability is formed.

DETAILED DESCRIPTION OF DISCLOSED EMBODIMENTS

Figure 1A:
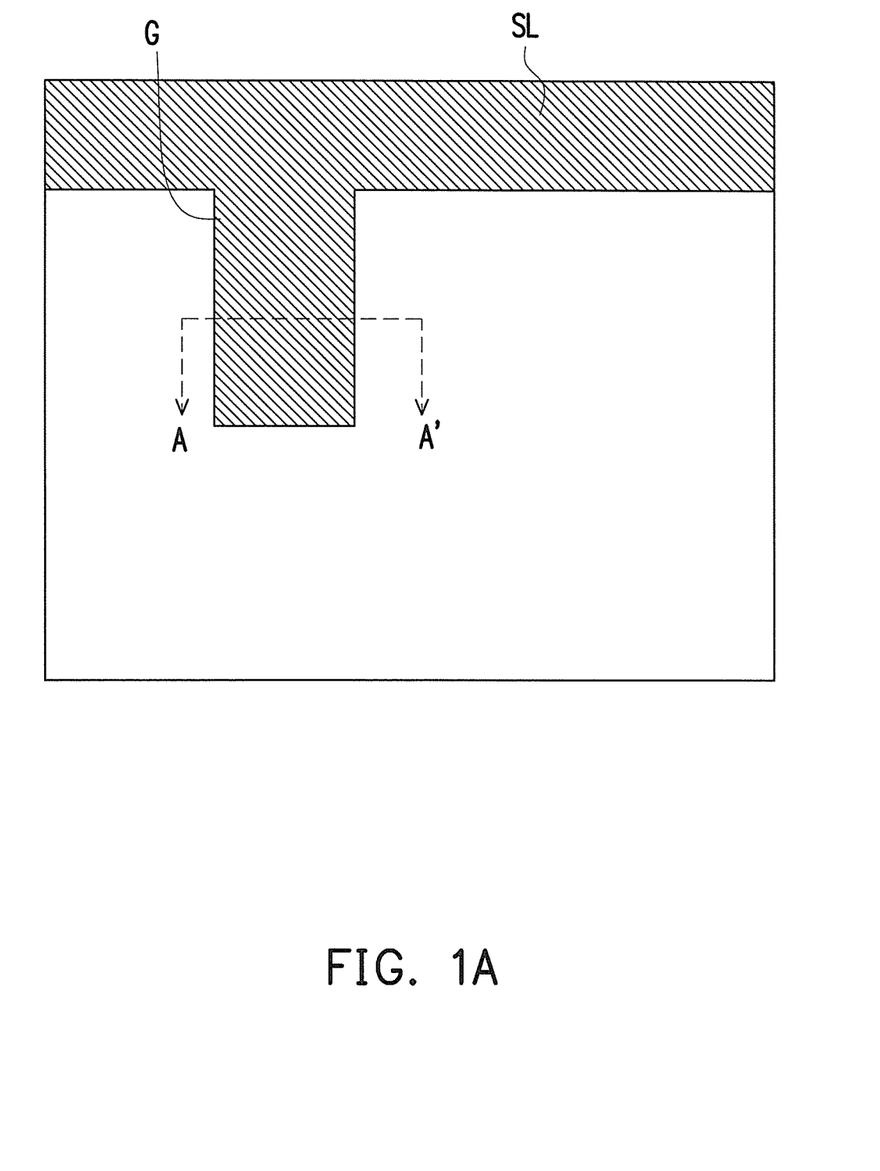
FIGS. 1A to 1E are top view schematic diagrams illustrating a manufacturing procedure of an oxide semiconductor thin film transistor according to an embodiment of the disclosure.

FIGS. 1A to 1E are top view schematic diagrams illustrating a manufacturing procedure of an oxide semiconductor thin film transistor according to an embodiment of the disclosure. FIGS. 2A to 2E are respectively cross-sectional views along a section line A-A' depicted in FIGS. 1A to 1E. It should be noted that some layers are not shown in the top view schematic diagrams of FIGS. 1A to 1E to clearly show the position of each element. Referring to FIGS. 1A and 2A, a scan line SL, a gate G, and a gate insulation layer 110 are formed on a substrate 102. To be more specific, a sputtering process may be used to form a gate material layer, then a patterning process is used to define the scan line SL and the gate G. The patterning process is, for example, a photo-mask process, including processes of photo-resist coating, exposure, developing, etching, and stripping. A material of the gate material layer includes chromium (Cr), molybdenum (Mo), aluminum (Al), titanium (Ti), an alloy thereof, or other appropriate conductive materials. The gate material may be a stack layer of the metal or metal alloy above.

Then, the gate insulation layer 110 is formed on the substrate 102. The gate insulation layer 110 covers the gate G and the scan line SL. The gate insulation layer 110 may be formed with a process of plasma-enhanced chemical vapor deposition (PEVCD), and a material of the gate insulation layer 110 includes silicon dioxide (SiO2), silicon nitride (SiNx), or other appropriate insulation materials.

Figure 1B:
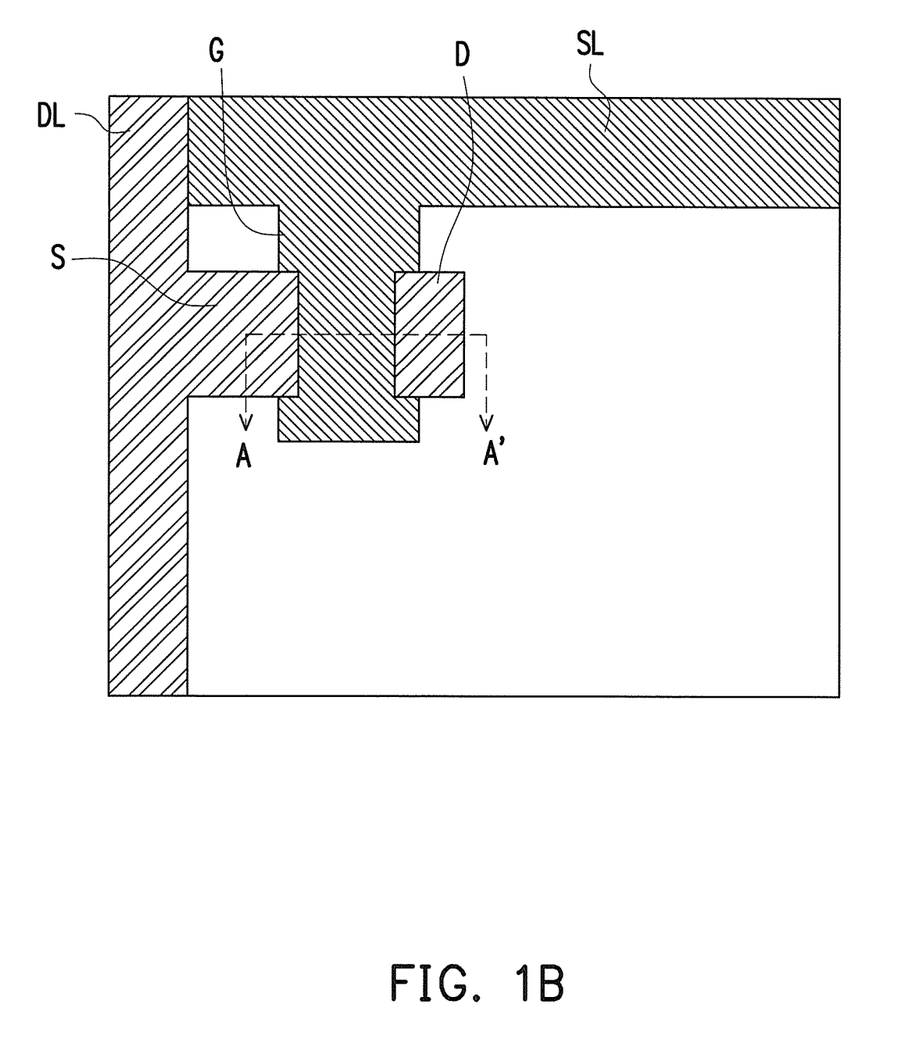
Figure 2A:
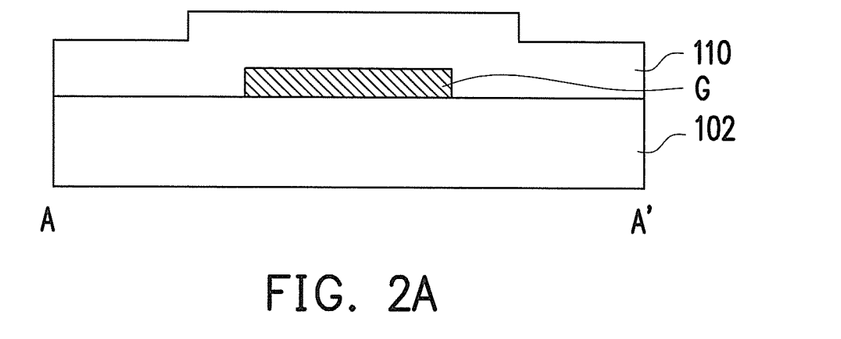
FIGS. 2A to 2E are respectively cross-sectional views along a section line A-A' depicted in FIGS. 1A to 1E.
Figure 2B:
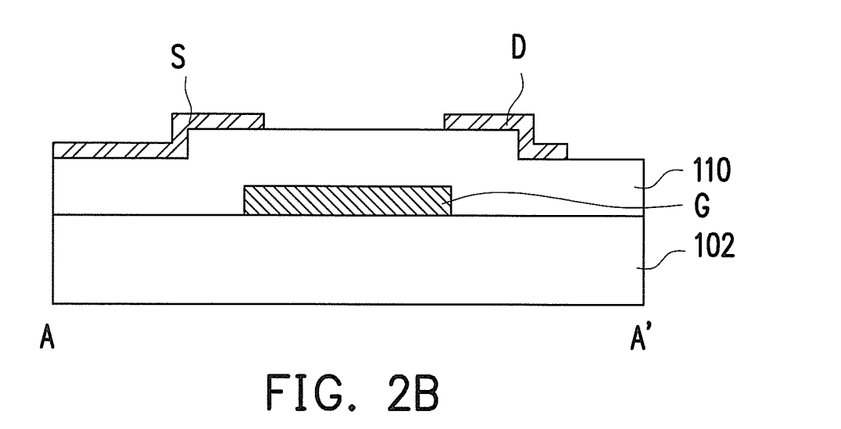

Referring to FIGS. 1B and 2B, a data line DL, a source S, and a drain D is formed on the substrate 102. To be more specific, a sputtering process may be used to form a source/drain material layer, then a patterning process is used to define the data line DL, the source S, and the drain D. The patterning process is, for example, a photo-mask process, including processes of photo-resist coating, exposure, developing, etching, and stripping. A material of the source/drain material layer includes chromium (Cr), molybdenum (Mo), aluminum (Al), titanium (Ti), an alloy thereof, or other appropriate conductive materials. The source/drain material layer may be a stack layer of the metal or metal alloy above.

Figure 1C:
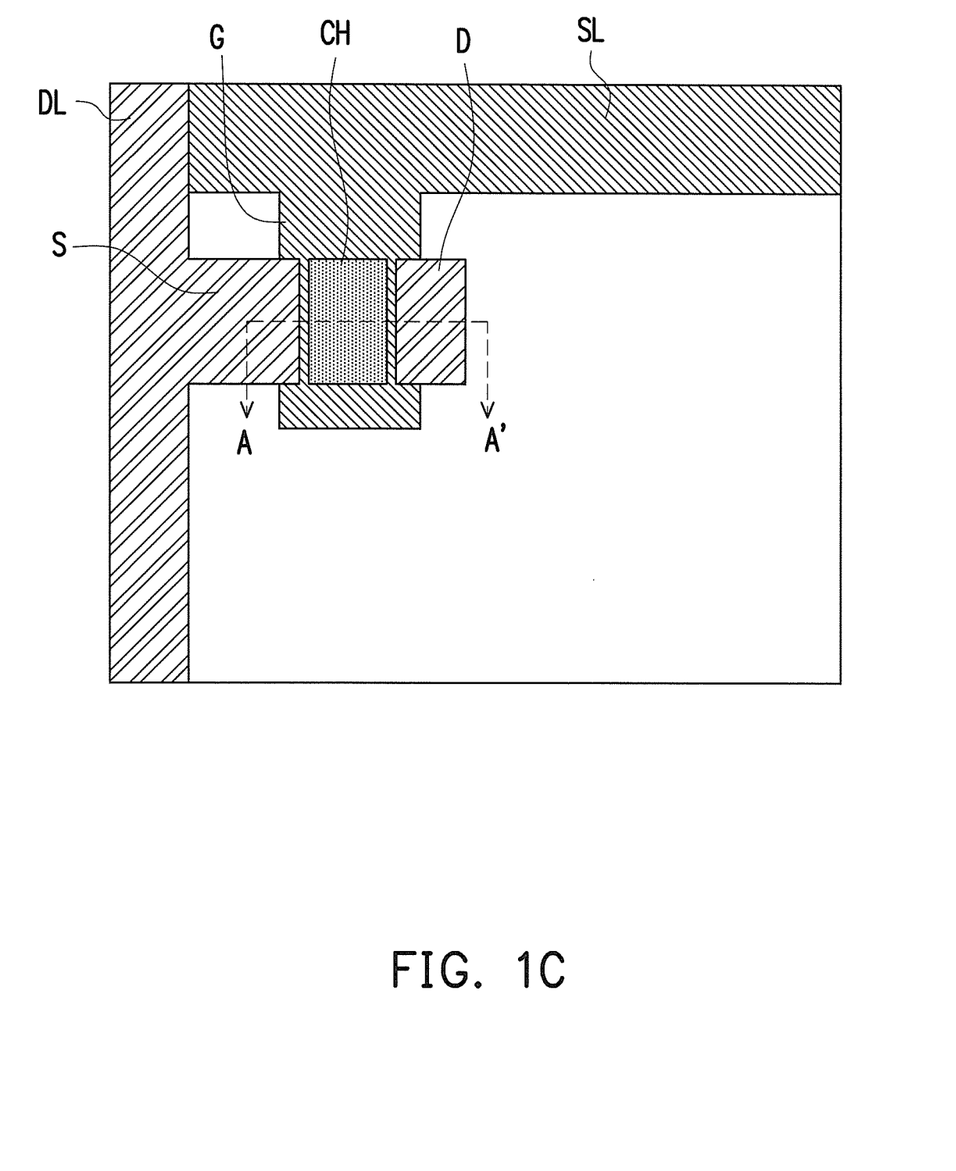
Figure 2C:
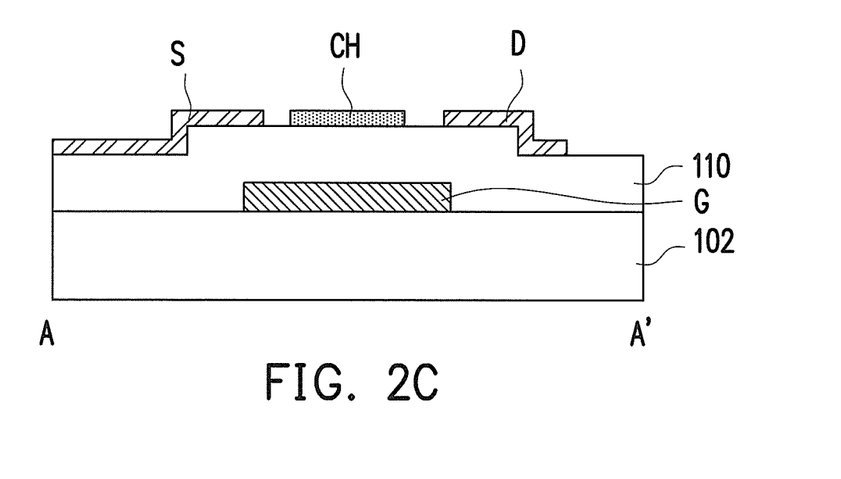

Referring to FIGS. 1C and 2C, a channel layer CH is formed between the source S and the drain D on the substrate 102. To be more specific, a channel material layer is formed on the substrate 102, wherein the channel material layer at least covers the source S and the drain D. A material of the channel material layer includes semiconductor materials such as polycrystalline silicon or amorphous silicon. Then, a patterning process is used to define the channel layer CH, wherein the channel layer CH is disposed above the gate G. The patterning process is, for example, a photo-mask process, including processes of photo-resist coating, exposure, developing, etching, and stripping. The channel layer CH and the source S are disposed separately, and the channel layer CH and the drain D are disposed separately. Therefore, the channel layer CH does not substantially contact the source S and the drain D. In other words, the channel layer CH does not cover the source S and the drain D. Therefore, the channel layer CH and the source S are not stacked with respect to each other, and the channel layer CH and the drain D are not stacked with respect to each other.

In this embodiment, the gas used in the sputtering process to form the channel material layer may result in an oxide layer formed on surfaces of the source S and the drain D. When the patterning process is used to define the channel layer CH, the patterning process may also remove the oxide layer on the surfaces of the source S and the drain D together, as the channel layer CH is disposed separately from the source S and the drain D (i.e. the channel layer CH does not cover the source S and the drain D). For example, etching procedure in the patterning process may be used, such that an etchant may react with the oxide layer to remove the oxide layer.

In addition, after the channel layer CH is formed, a surface treatment process may be selectively performed to remove the oxide layer on the surfaces of the source S and the drain D. In this way, it may be further ensured that there is no oxide layer on the surfaces of the source S and the drain D. For example, the surface treatment process may be wet etching, dry etching, or other appropriate surface treatment processes.

Figure 1D:
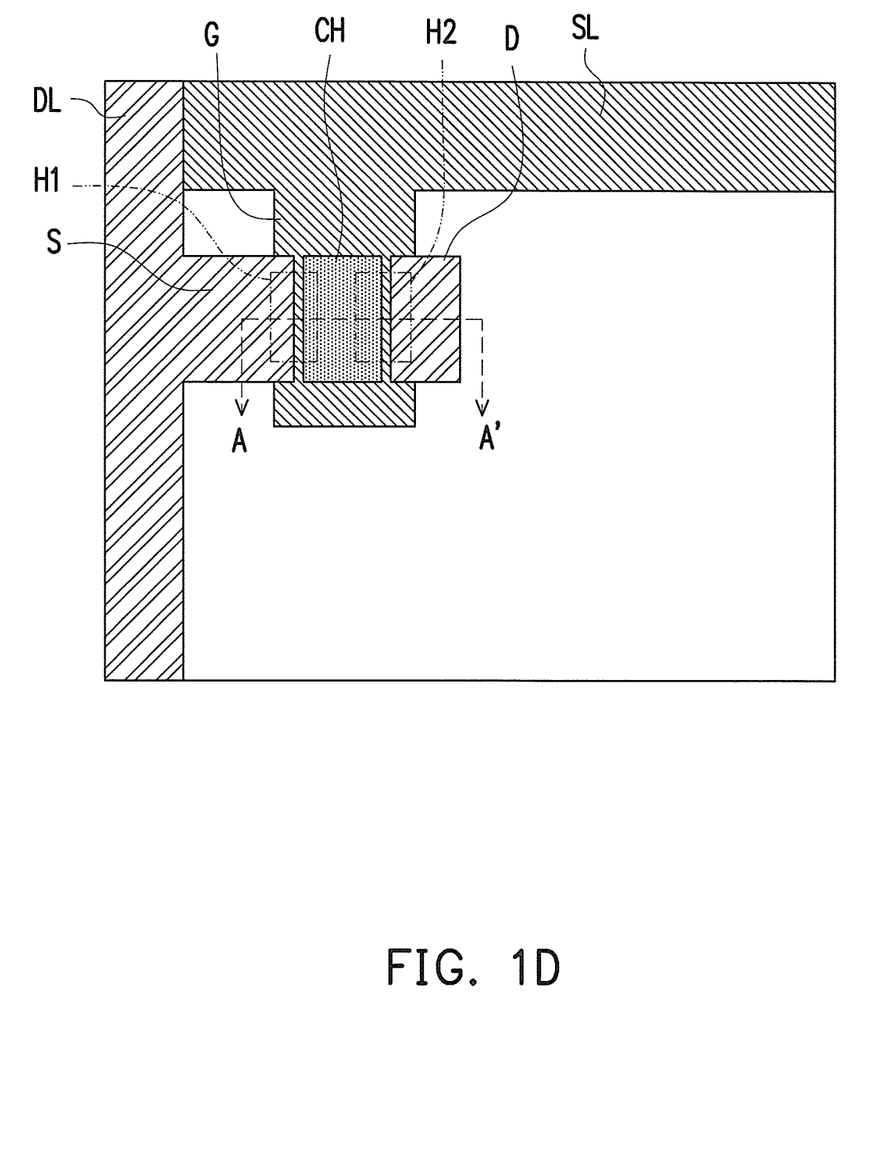
Figure 2D:
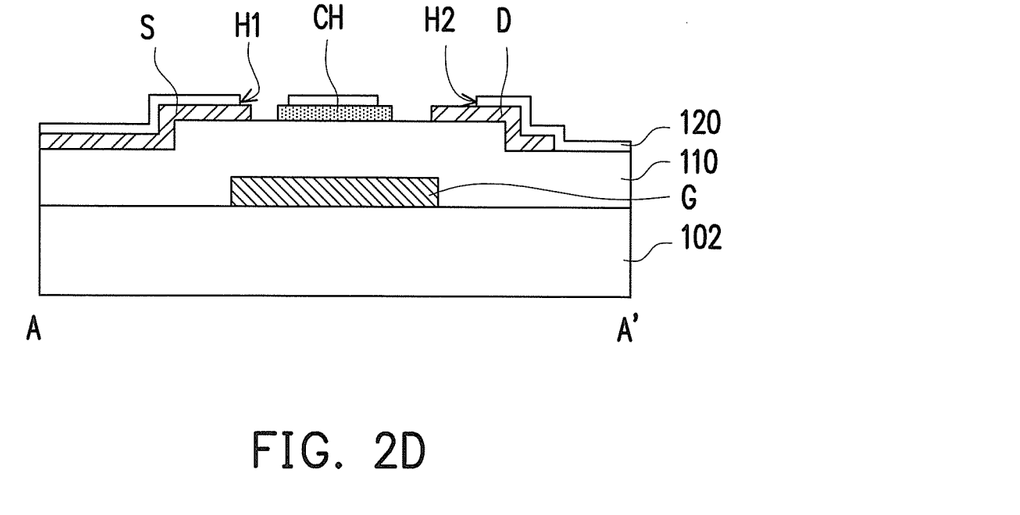

Referring to FIGS. 1D and 2D, an insulation layer 120 is formed on the substrate 102. The insulation layer 120 at least covers the source S, the drain D, the channel layer CH, and the substrate 102. In addition, the channel layer CH is located between the insulation layer 120 and the gate G. To be more specific, an insulation material layer is formed on the substrate 102, and a material of the insulation material layer includes silicon dioxide or other appropriate insulation materials. The insulation material layer may be formed through the process of PECVD or sputtering. Afterwards, a patterning process is used to define the insulation layer 120. The patterning process is, for example, a photo-mask process, including processes of photo-resist coating, exposure, developing, etching, and stripping.

The insulation layer 120 includes a first opening H1 and a second opening H2 that are separated from each other. The first opening H1 exposes adjacent portions of the source S and the channel layer CH at the same time. For example, the first opening H1 exposes a top surface of a portion of the source S and a top surface of a portion of the channel layer CH. Alternatively, the first opening H1 may only expose a side wall of the source S and a side wall of the channel layer CH.

The second opening H2 exposes adjacent portions of the drain D and the channel layer CH at the same time. For example, the second opening H2 exposes a top surface of a portion of the drain D and a top surface of a portion of the channel layer CH. Alternatively, the second opening H2 may only expose a side wall of the drain D and a side wall of the channel layer CH.

Figure 1E:
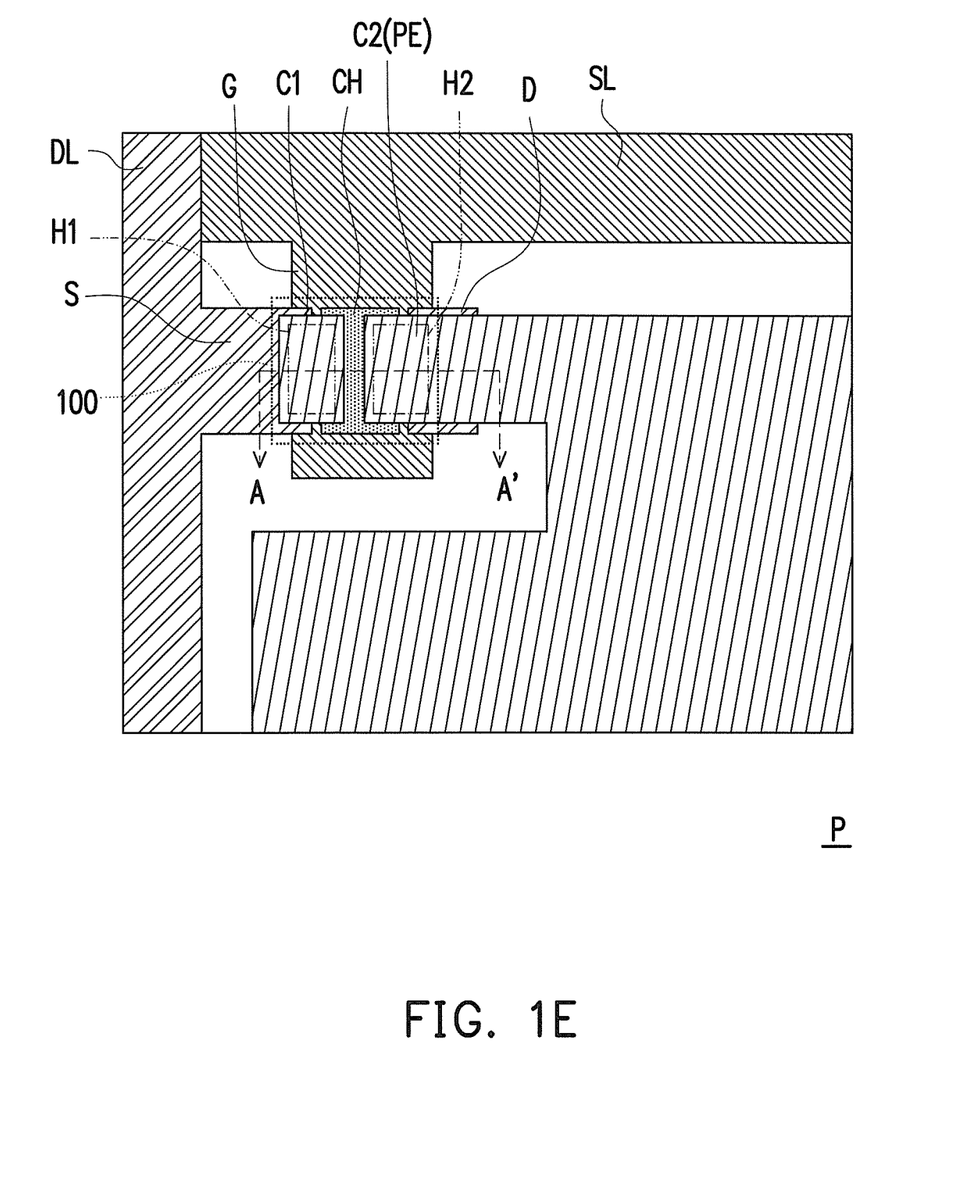
Figure 2E:
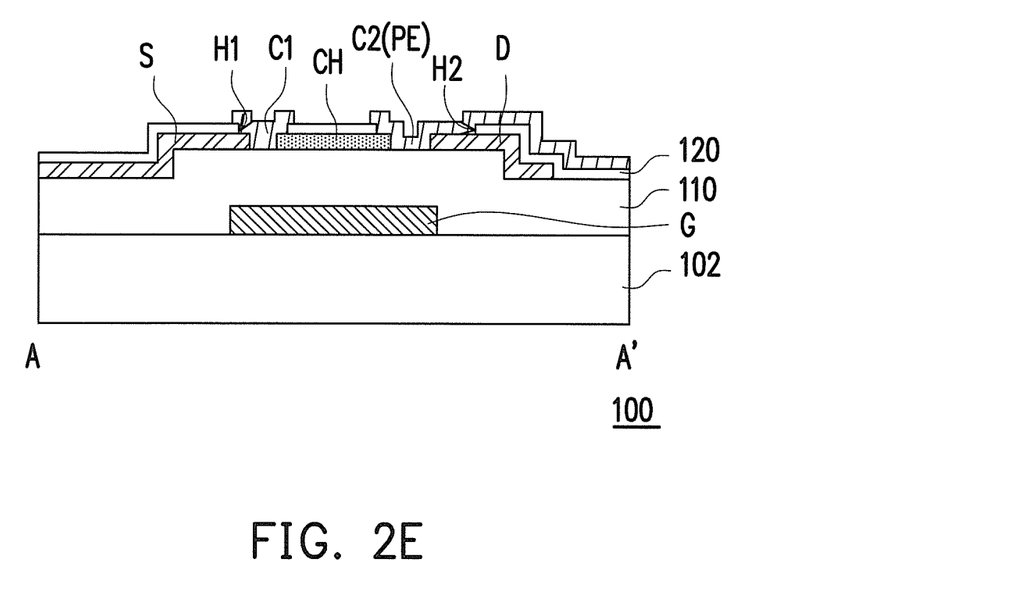

Referring to FIGS. 1E and 2E, a first conductor C1 and a second conductor C2 are formed on the substrate 102. To be more specific, a conductive material layer is formed on the substrate 102, and a material of the conductive material layer includes indium tin oxide (ITO), indium zinc oxide (IZO) or other appropriate conductive materials. Then, a patterning process is used to define the first conductor C1 and the second conductor C2. The patterning process is, for example, a photo-mask process, including processes of photo-resist coating, exposure, developing, etching, and stripping. In this embodiment, the first conductor C1 and the second conductor C2 may be formed at the same time. In other embodiments, the first conductor C1 and the second conductor C2 may be formed sequentially. The disclosure is not limited on a forming order between the first conductor C1 and the second conductor C2.

The first conductor C1 is at least located in the first opening H1 and is coupled with the exposed portions of the source S and the channel layer CH in the first opening H1. In this embodiment, the first conductor C1 is further extended onto a surface of the insulation layer 120. For example, the first conductor C1 may directly contact the source S and the channel layer CH for electrical connection. As previously described, since there is hardly any oxide layer on the surface of the source S, there may be a lower contact impedance between the first conductor C1 and the source S.

The second conductor C2 is at least located in the second opening H2, and is coupled with the exposed portions of the drain D and the channel layer CH in the second opening H2. In this way, an oxide semiconductor thin film transistor 100 of this embodiment is roughly completed. In this embodiment, the second conductor C2 is further extended into an area external to the second opening H2 to serve as a pixel electrode PE. In other words, the pixel electrode PE serves as a connective conductor between the drain D and the channel layer CH in this embodiment. In this way, the scan line SL, the data line DL, the pixel electrode PE, and the oxide semiconductor thin film transistor 100 form a pixel structure P.

The second conductor C2 may directly contact the drain D and the channel layer CH for electrical connection. As previously described, since there is hardly any oxide layer on the surface of the drain D, there may be a lower contact impedance between the second conductor C2 and the drain D. In addition, as the source S and the drain D in this embodiment are manufactured before manufacture of the channel layer CH, the issue that an etchant damages the channel layer CH when the source S and the drain D are patterned in the conventional art is avoided. In this way, the oxide semiconductor thin film transistor 100 of this embodiment has a preferable device reliability.

Figure 3:
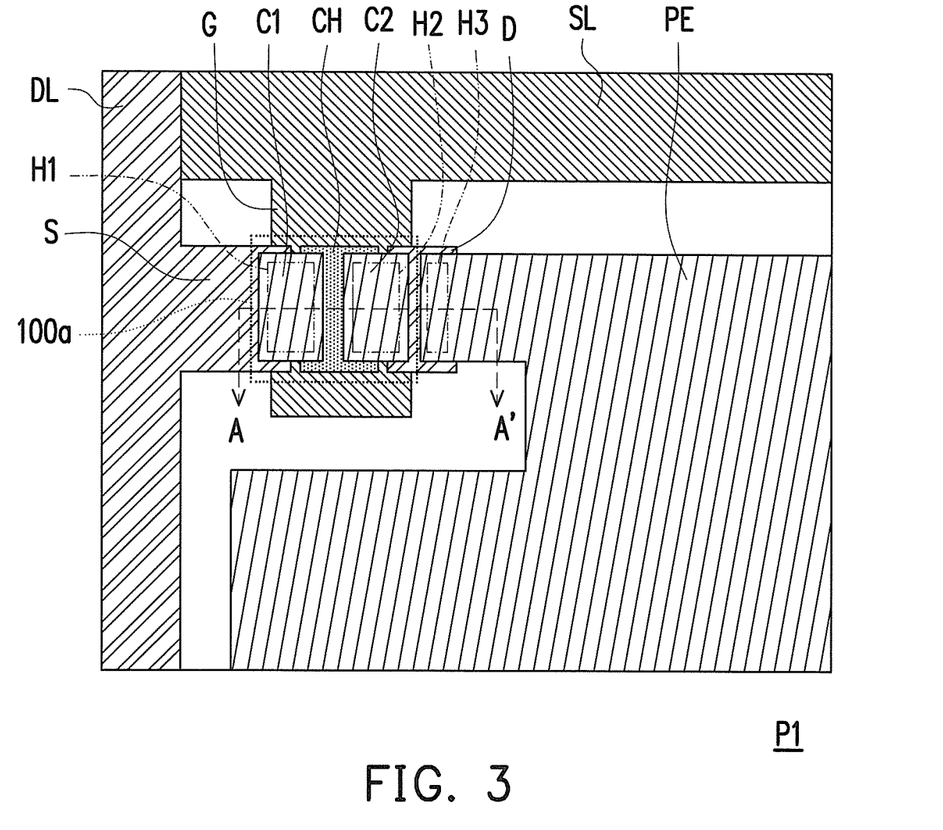
FIG. 3 is a top view schematic diagram illustrating a manufacturing procedure of an oxide semiconductor thin film transistor according to another embodiment of the disclosure.
Figure 4:
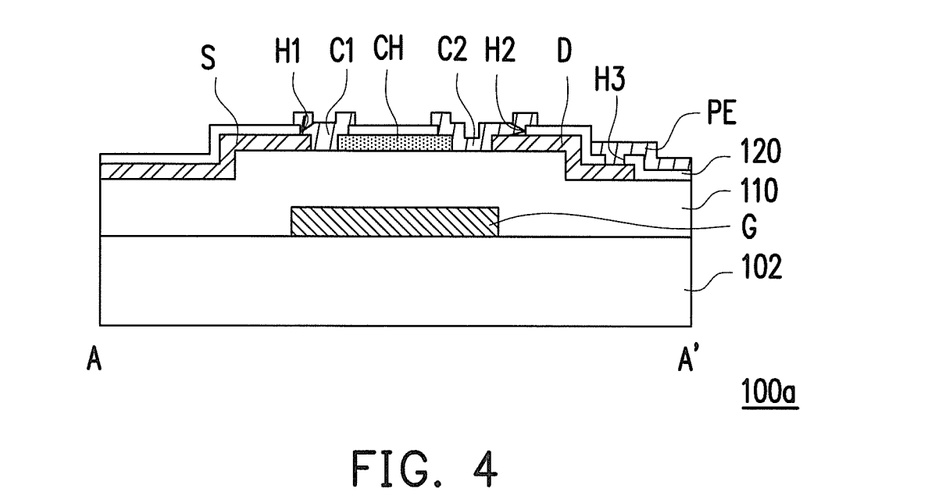
FIG. 4 is a cross-sectional view along a section line A-A' depicted in FIG. 3.

In addition, the embodiment is described with an example that the second conductor C2 serves as the connective conductor of the drain D and the channel layer CH and as the pixel electrode PE of the pixel structure P at the same time. However, the disclosure is not limited thereto. In other embodiments, the second conductor C2 in an oxide semiconductor thin film transistor 100a may only serve to connect the drain D and the channel layer CH. In addition, a pixel electrode PE is further formed when the first conductor C1 and the second conductor C2 are formed. The pixel electrode PE is separated from the second conductor C2, and the pixel electrode PE is electrically connected with the drain D through a third opening H3 of the insulation layer 120, as shown in FIGS. 3 and 4. Naturally, this embodiment does not limit on a manufacturing order between the first conductor C1, the second conductor C2, and the pixel electrode PE.

Figure 5A:
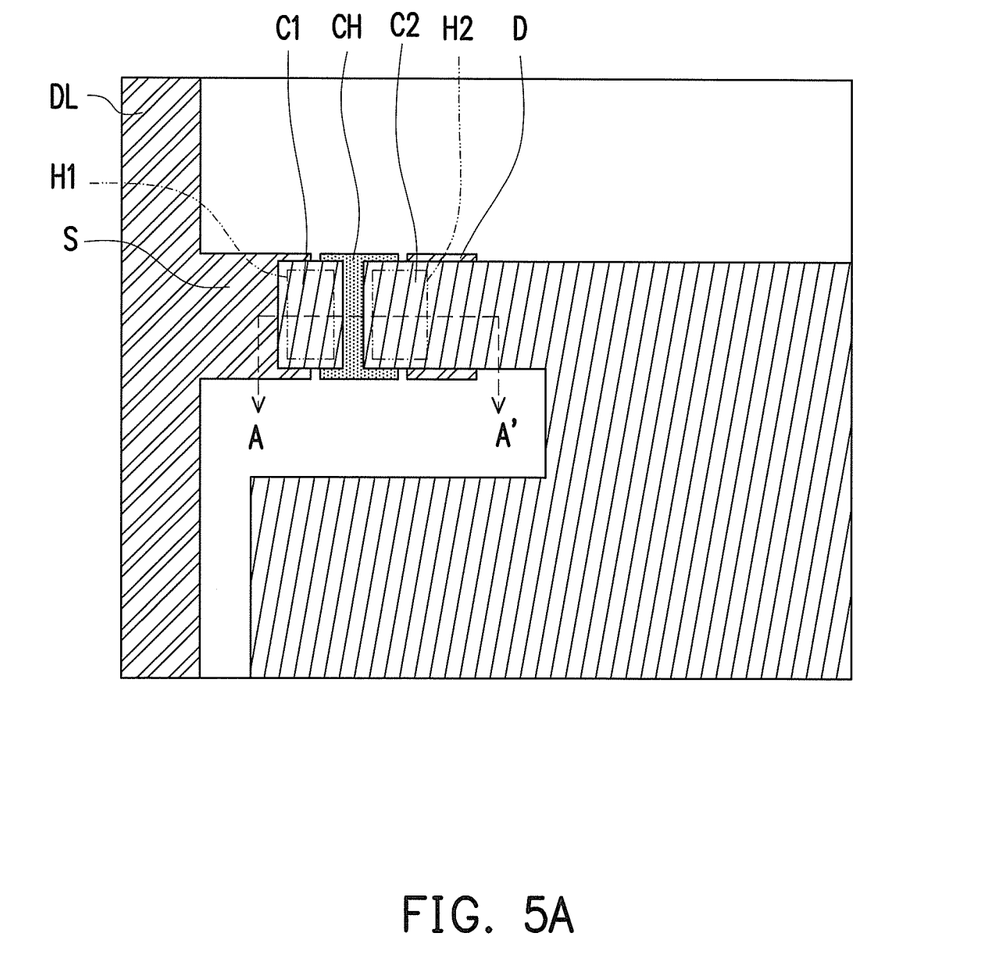
FIGS. 5A to 5B are top view schematic diagrams illustrating a manufacturing procedure of an oxide semiconductor thin film transistor according to another embodiment of the disclosure.
Figure 5B:
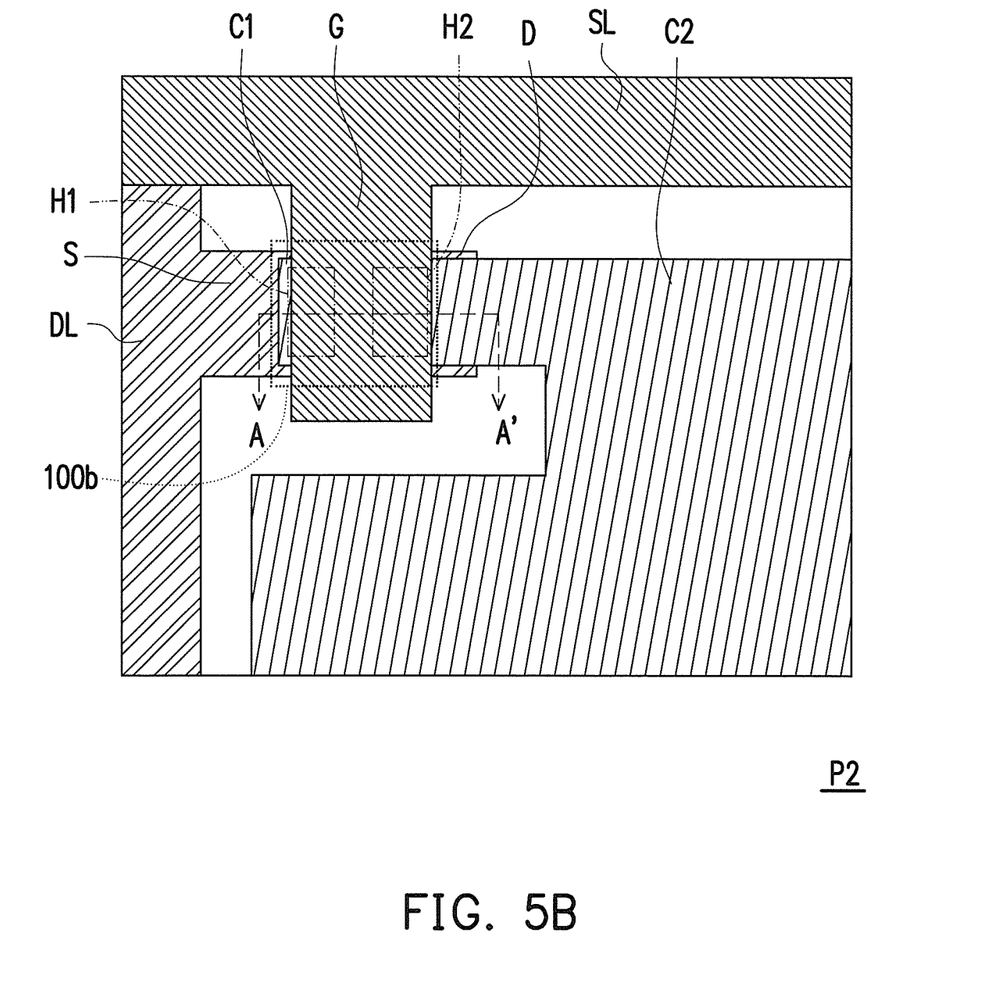
Figure 6A:
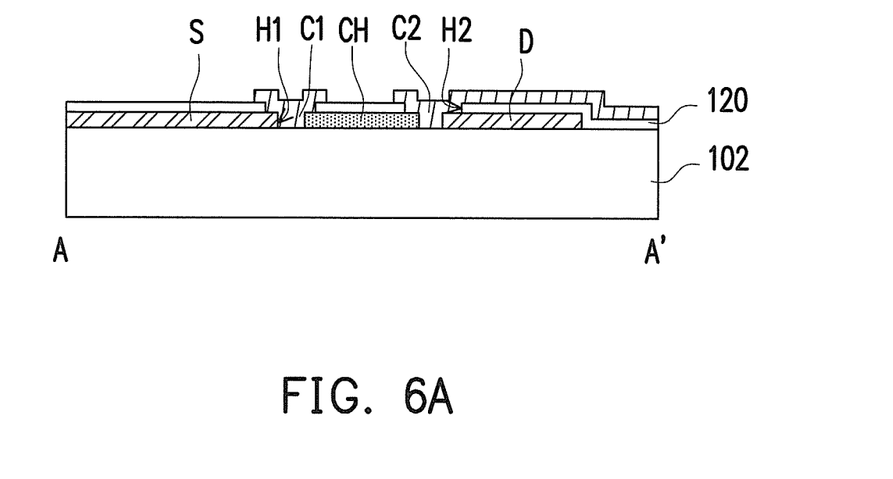
FIGS. 6A to 6B are respectively cross-sectional views along a section line A-A' depicted in FIGS. 5A to 5B.
Figure 6B:
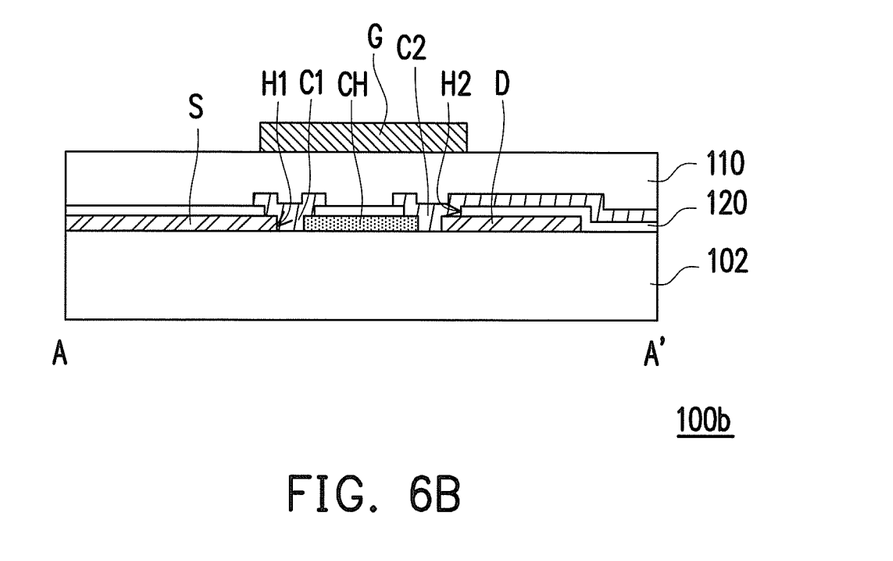

The oxide semiconductor thin film transistor 100 and the oxide semiconductor thin film transistor 100a in the previously described embodiments are described to be a bottom gate type thin film transistor as an example. However, the disclosure is not limited thereto. FIGS. 5A to 5B are top view schematic diagrams illustrating a manufacturing procedure of an oxide semiconductor thin film transistor according to another embodiment of the disclosure. FIGS. 6A to 6B are respectively cross-sectional views along a section line A-A' depicted in FIGS. 5A to 5B. The manufacturing procedure of this embodiment is similar to those of the previously described embodiments, with a difference that the gate insulation layer 110 and the gate G are formed after the first conductor C1 and the second conductor C2 are formed. In other words, an oxide semiconductor thin film transistor 100b is a top gate type thin film transistor.

To be more specific, after the manufacturing procedure illustrated in FIGS. 1B to 1E and FIGS. 2B to 2E, a structure shown in FIGS. 5A and 6A may be formed. The source S, the drain D, the channel layer CH, for example, are directly disposed on the substrate 102, and the insulation layer 120, the first conductor C1, and the second conductor C2 are manufactured sequentially.

Referring to FIGS. 5B and 6B, the gate insulation layer 110 is formed on the substrate 102. The gate insulation layer 110 covers the source S, the drain D, the channel layer CH, the insulation layer 120, the first conductor C1 and the second conductor C2. The gate insulation layer 110 may be formed with the process of PEVCD, and the material of the gate insulation layer 110 includes silicon dioxide (SiO2), silicon nitride (SiNx), or other appropriate insulation materials.

Then the scan line SL and the gate G are formed on the gate insulation layer 110. So far, the oxide semiconductor thin film transistor 100b is roughly completed. The scan line SL, the data line DL, the oxide semiconductor thin film transistor 100b, and the pixel electrode PE form a pixel structure P2. To be more specific, a sputtering process may be used to form a gate material layer, then a patterning process is used to define the scan line SL and the gate G. The patterning process is, for example, a photo-mask process, including processes of photo-resist coating, exposure, developing, etching, and stripping. A material of the gate material layer includes chromium (Cr), molybdenum (Mo), aluminum (Al), titanium (Ti), an alloy thereof, or other appropriate conductive materials. The gate material layer may be a stack layer of the metal or metal alloy above. In this embodiment, the gate G is substantially disposed above the channel layer CH, and the gate insulation layer 110 is disposed between the gate G and the channel layer CH.

Based on the above, in the manufacturing method of the oxide semiconductor thin film transistor of the disclosure, the semiconductor, the source, and the drain that are separated from each other are formed. The source and the channel layer are coupled through the first conductor, and the drain and the channel layer are coupled through the second conductor. There is hardly any oxide layer above the surface of the source, and there is hardly any oxide layer above the surface of drain. Therefore, the oxide semiconductor thin film transistor has a preferable reliability. In addition, as the source and the drain of the disclosure are manufactured before manufacture of the channel layer, the issue that an etchant damages the channel layer when the source and the drain are patterned in the conventional art is avoided. In this way, the oxide semiconductor thin film transistor of the disclosure has a preferable reliability.

What is claimed is:

1. An oxide semiconductor thin film transistor, comprising:
    a source and a drain;
    a channel layer, disposed between the source and the drain and separated from the source and the drain;
    an insulation layer, covering the source, the drain, and the channel layer, wherein the insulation layer has a first opening and a second opening, the first opening exposing a portion of the source and a portion of the channel layer, and the second opening exposing a portion of the drain and a portion of the channel layer;
    a first conductor, at least disposed in the first opening to be coupled with the source and the channel layer; and
    a second conductor, at least disposed in the second opening to be coupled with the drain and the channel layer.

2. The oxide semiconductor thin film transistor as claimed in claim 1, wherein the first conductor and the second conductor belong to the same film layer.

3. The oxide semiconductor thin film transistor as claimed in claim 1, further comprising a gate, wherein the channel layer is disposed on the gate and is located between the insulation layer and the gate.

4. The oxide semiconductor thin film transistor as claimed in claim 1, further comprising a gate, wherein the gate is disposed on the channel layer, and the insulation layer is located between the gate and the channel layer.

* * * * *